(12) United States Patent
Tsai et al.

(10) Patent No.: US 11,810,835 B2
(45) Date of Patent: Nov. 7, 2023

(54) INTELLIGENT POWER MODULE PACKAGING STRUCTURE

(71) Applicant: ACTRON TECHNOLOGY CORPORATION, Taoyuan (TW)

(72) Inventors: Hsin-Chang Tsai, Taoyuan (TW); Ching-Wen Liu, Taoyuan (TW)

(73) Assignee: ACTRON TECHNOLOGY CORPORATION, Taoyuan (TW)

( * ) Notice: Subject to any disclaimer, the term of this patent is extended or adjusted under 35 U.S.C. 154(b) by 174 days.

(21) Appl. No.: 17/082,030

(22) Filed: Oct. 28, 2020

(65) Prior Publication Data
US 2022/0068754 A1 Mar. 3, 2022

(30) Foreign Application Priority Data
Aug. 28, 2020 (TW) ................... 109129435

(51) Int. Cl.
*H01L 23/373* (2006.01)
*H01L 23/498* (2006.01)
(Continued)

(52) U.S. Cl.
CPC ...... *H01L 23/3735* (2013.01); *H01L 23/3157* (2013.01); *H01L 23/49861* (2013.01); *H01L 23/5386* (2013.01)

(58) Field of Classification Search
CPC ........... H01L 23/49541; H01L 23/3735; H01L 23/3157; H01L 23/49861; H01L 23/5386;
(Continued)

(56) References Cited

U.S. PATENT DOCUMENTS 4,340,902 A * 7/1982 Honda .............. H01L 23/49541
174/547
8,120,153 B1 * 2/2012 Shen ................. H01L 23/49537
257/789
(Continued)

FOREIGN PATENT DOCUMENTS

CN 101213663 A * 7/2008 ............. H01L 24/39
CN 101283449 A * 10/2008 ............. H05K 7/205
(Continued)

OTHER PUBLICATIONS

"Office Action of Taiwan Counterpart Application", dated Mar. 26, 2021, pp. 1-6.
(Continued)

*Primary Examiner* — Patricia D Valenzuela
(74) *Attorney, Agent, or Firm* — JCIPRNET

(57) ABSTRACT

An intelligent power module packaging structure includes an insulated heat dissipation substrate, a plurality of power devices, a control chip, a lead frame, and an encapsulant. The insulated heat dissipation substrate has a first surface and a second surface opposite to the first surface. The power devices are disposed on the first surface. The control chip is disposed on the first surface. The control chip provides a gate driver function for driving the power devices and a pulse width modulation function. The lead frame is bonded onto the first surface. The power devices are electrically connected to the control chip and the lead frame. The encapsulant at least encapsulates the power devices, the control chip, and a portion of the lead frame, and the second surface is entirely or partially exposed outside the encapsulant.

13 Claims, 2 Drawing Sheets

(51) Int. Cl.
*H01L 23/538* (2006.01)
*H01L 23/31* (2006.01)

(58) Field of Classification Search
CPC ....... H01L 23/3107; H01L 2224/40225; H01L 2224/48137; H01L 2224/48227; H01L 2224/48247; H01L 2224/73221; H01L 2924/181; H01L 2924/19105; H01L 23/4334; H01L 23/49524; H01L 23/49531; H01L 23/49562; H01L 23/49575; H01L 2224/48139; H01L 2224/32245; H01L 23/4986
USPC .......................................................... 257/678
See application file for complete search history.

(56) References Cited

U.S. PATENT DOCUMENTS

| | | | |
|---|---|---|---|
| 9,218,987 B2 | 12/2015 | Liu et al. | |
| 2003/0057573 A1* | 3/2003 | Sekine | H01L 23/3135 257/796 |
| 2006/0284211 A1* | 12/2006 | Takubo | H01L 25/072 257/E25.031 |
| 2007/0216377 A1* | 9/2007 | Yoshimura | H04L 25/0266 323/250 |
| 2012/0014069 A1* | 1/2012 | Zeng | H01L 23/49575 29/841 |
| 2013/0082334 A1 | 4/2013 | Nakamura et al. | |
| 2018/0269147 A1* | 9/2018 | Yeo | H01L 24/84 |
| 2019/0006258 A1* | 1/2019 | Muto | H01L 24/48 |
| 2021/0111092 A1* | 4/2021 | Wakiyama | H01L 23/49844 |

FOREIGN PATENT DOCUMENTS

| | | | | |
|---|---|---|---|---|
| CN | 102340233 A | * | 2/2012 | ........... H05K 7/1432 |
| CN | 103872006 | | 1/2017 | |
| CN | 103681571 B | * | 3/2017 | ....... H01L 23/49575 |
| CN | 107895697 A | * | 4/2018 | ....... H01L 23/49531 |
| CN | 109216299 A | * | 1/2019 | ............. H01L 23/36 |
| CN | 109216313 A | * | 1/2019 | ........... H01L 25/072 |
| CN | 209356888 U | * | 9/2019 | |
| CN | 210956665 U | * | 7/2020 | ... H01L 2224/48137 |
| CN | 114695333 A | * | 7/2022 | ............. H01L 25/50 |
| EP | 3021480 A1 | * | 5/2016 | .... H01L 2224/49113 |
| JP | 2000133768 A | * | 5/2000 | ... H01L 2224/48091 |
| JP | 2011249410 | | 12/2011 | |
| JP | 2013041939 | | 2/2013 | |
| JP | 2018031590 A | * | 3/2018 | .... H01L 2224/49111 |
| KR | 101964763 B1 | * | 8/2019 | ....... H01L 23/49541 |
| TW | 200522294 | | 7/2005 | |
| TW | M458666 | | 8/2013 | |
| TW | 201824465 | | 7/2018 | |
| TW | I677155 | | 11/2019 | |
| WO | 2019244372 | | 12/2019 | |

OTHER PUBLICATIONS

"Office Action of Japan Counterpart Application", dated Mar. 25, 2022, p. 1-p. 3.
"Office Action of Taiwan Counterpart Application", dated Nov. 16, 2021, pp. 1-7.

* cited by examiner

INTELLIGENT POWER MODULE PACKAGING STRUCTURE

CROSS-REFERENCE TO RELATED APPLICATION

This application claims the priority benefit of Taiwan application serial no. 109129435, filed on Aug. 28, 2020. The entirety of the above-mentioned patent application is hereby incorporated by reference herein and made a part of this specification.

BACKGROUND

Technical Field

The disclosure relates to a packaging structure, and in particular, to an intelligent power module packaging structure applied in a power electronics unit.

Description of Related Art

In an existing power electronics unit, packages providing different functions (e.g., a power device package and a driver device package), a module, and a controller device, etc. are required to be arranged on a printed circuit board (PCB) in a dispersed manner most of the time before the system is driven to function effectively.

Nevertheless, in this way, excessively far distances are provided among the packages providing different functions, the module, and the circuit device. The parasitic impedance of the driver circuit is thereby increased, efficiency of the power electronics unit is decreased, an system occupied area is generated owing to the foregoing dispersed arrangement manner, and the assembly yield is also lowered. As such, how to effectively reduce the parasitic impedance of the driver circuit, enhance the efficiency of the power electronics unit, lower the system occupied area, and improve the assembly yield are important issues.

SUMMARY

The disclosure provides an intelligent power module packaging structure capable of effectively reducing a parasitic impedance of a driver circuit, enhancing efficiency of a power electronics unit, lowering a system occupied area, and improving an assembly yield.

An intelligent power module packaging structure provided by the disclosure includes an insulated heat dissipation substrate, a plurality of power devices, a control chip, a lead frame, and an encapsulant. The insulated heat dissipation substrate has a first surface and a second surface opposite to the first surface. The power devices are disposed on the first surface. The control chip is disposed on the first surface. The control chip provides a gate driver for driving the power devices and a pulse width modulation controller for controlling the power devices. The lead frame is bonded onto the first surface. The power devices are electrically connected to the control chip and the lead frame. The encapsulant at least encapsulates the power devices, the control chip, and a portion of the lead frame, and the second surface is entirely or partially exposed outside the encapsulant.

To sum up, in the intelligent power module packaging structure provided by the disclosure, the power devices and the control chip (including the gate driver and the pulse width modulation controller) are encapsulated through the encapsulant, such that devices providing different functions are integrated into one packaging structure, and distances among the devices are reduced. As such, the parasitic impedance of the driver circuit is effectively reduced, the efficiency of the power electronics unit is enhanced, the excessive area ratio is lowered, and the assembly yield is improved. Besides, the power devices and the control chip (providing the gate driver for driving the power devices and a pulse width modulation controller for controlling the power devices) are disposed on the first surface of the insulated heat dissipation substrate, and the second surface of the insulated heat dissipation substrate is entirely or partially exposed outside the encapsulant. In this way, heat dissipation efficiency of the intelligent power module packaging structure may be enhanced, and favorable performance may thus be achieved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
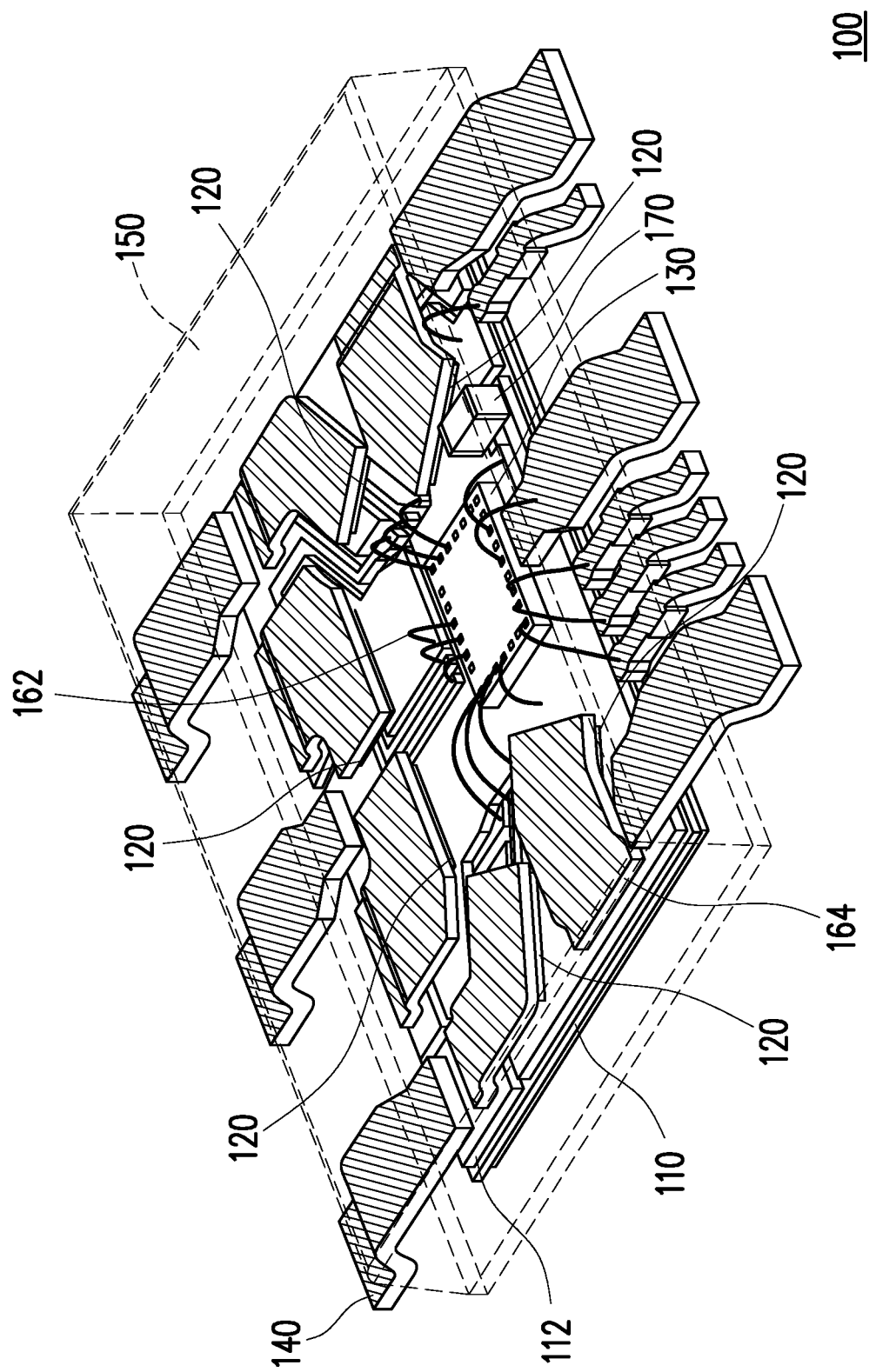
FIG. 1A is a three-dimensional schematic view of an intelligent power module packaging structure according to an embodiment of the disclosure.

Exemplary embodiments of the disclosure will be described comprehensively below with reference to the drawings, but the disclosure may be embodied in many different forms and should not be construed as being limited to the embodiments described herein. For clarity, in the drawings, sizes and thicknesses of regions, portions and layers are not illustrated in accordance with actual proportions. To facilitate understanding, the same components will hereinafter be denoted by the same reference numerals.

Figure 1B:
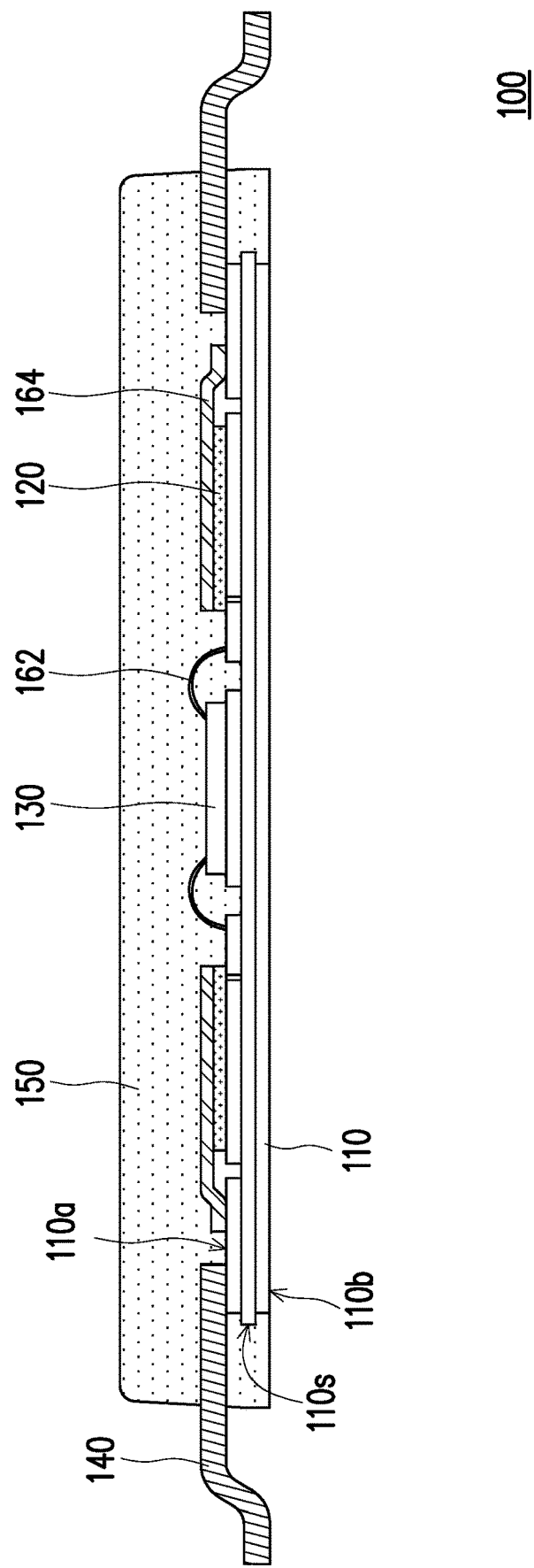
FIG. 1B is a cross-sectional schematic view of the intelligent power module packaging structure according to an embodiment of the disclosure.

FIG. 1A is a three-dimensional schematic view of an intelligent power module packaging structure according to an embodiment of the disclosure. FIG. 1B is a cross-sectional schematic view of the intelligent power module packaging structure according to an embodiment of the disclosure.

With reference to FIG. 1A and FIG. 1B together, in this embodiment, an intelligent power module packaging structure 100 includes an insulated heat dissipation substrate 110, a plurality of power devices 120 (six power devices 120 are schematically shown in FIG. 1A), a control chip 130, a lead frame 140, and an encapsulant 150. In some embodiments, the insulated heat dissipation substrate 110 includes, for example, a direct bond copper (DBC) substrate, an insulated metal substrate (IMS), or a printed circuit board (PCB) substrate. Nevertheless, the disclosure should not be construed as limited thereto. The insulated heat dissipation substrate 110 may also be a suitable insulated substrate providing a favorable heat dissipation function, as long as heat may be effectively conducted out by a device disposed thereon subsequently through the insulated heat dissipation substrate 110.

In this embodiment, the insulated heat dissipation substrate 110 has a first surface 110a and a second surface 110b opposite to the first surface 110a, and the power devices 120 are disposed on the first surface 110a. For instance, the first surface 110a is, for example an upper surface, and the second surface 110b is, for example, a lower surface. In some embodiments, each of the power devices 120 may be a metal-oxide-semiconductor field-effect transistor (MOSFET), a fast recovery diode (FRD), an insulated gate bipolar transistor (IGBT), a silicon carbide (SiC) wide band gap semiconductor transistor, a gallium nitride (GaN) wide band gap semiconductor transistor, or a combination of the foregoing. Nevertheless, the disclosure should not be construed as limited thereto. Note that in the disclosure, a number of the power devices 120 is not particularly limited, and a type and the number of the power devices 120 may both be determined according to actual design needs.

In some embodiments, the power devices 120 may be disposed on the first surface 110a through a flip chip manner, such that a thermal conduction path between one power device 120 and one power device 120 may be shortened, and heat dissipation efficiency is thereby enhanced. Further, since the power devices 120 are disposed on the first surface 110a in the flip chip manner (that is, active region faces downward), the active region of the power devices 120 are close to the insulated heat dissipation substrate 110. A distance between the active region of the power devices 120 and the insulated heat dissipation substrate 110 is short, as such, heat generated by the power devices 120 during operation may be effectively dissipated through the insulated heat dissipation substrate 110.

In addition, when the power devices 120 are disposed on the first surface 110a through the flip chip manner (that is, the active region faces downward), a thermal resistance may also be lowered. For instance, in some embodiments, the thermal resistance of the power devices 120 disposed on the insulated heat dissipation substrate 110 is 0.155 (° C./W) when the active region is in face upward. But the thermal resistance of the power devices 120 disposed on the insulated heat dissipation substrate 110 could be reduced to 0.137 (° C./W) when putting the active region in face downward. It thus can be seen that the thermal resistance is effectively lowered by 15% when the power devices 120 are disposed through the flip chip manner (that is, the active region faces downward). Nevertheless, the disclosure should not be construed as limited thereto.

In this embodiment, the control chip 130 is disposed on the first surface 110a, such that the intelligent power module packaging structure 100 may carry devices providing different functions. Further, the control chip 130 may include a gate driver and a pulse width modulation (PWM) controller. As such, the control chip 130 may provide a gate driver function for driving the power devices 120 and a pulse width modulation function for controlling the power devices 120, so that a power electronics unit may function smoothly. For instance, the power electronics unit is, for example, a motor driver system, and the control chip 130 includes a motor controller, the gate driver having the gate driver function for driving the power devices 120, and the pulse width modulation controller having the pulse width modulation function for controlling the power devices 120. Nevertheless, the disclosure should not be construed as limited thereto. The power devices 120 and the control chip 130 providing different functions may be used corresponding to different power electronics units, such that the intelligent power module packaging structure 100 provided by the present embodiment provides considerable flexibility in use. In addition, in some embodiments, the control chip 13 may be disposed on the first surface in a die-bonding manner (that is, the active region faces upward). Nevertheless, the disclosure should not be construed as limited thereto.

In this embodiment, the lead frame 140 is bonded onto the first surface 110a, and the power devices 120 are electrically connected to the control chip 130 and the lead frame 140. A material of the lead frame 140 is, for example, gold, silver, copper, or aluminum. Further, the insulated heat dissipation substrate 110 may include a top metal layer 112 close to the first surface 110a. A material of the top metal layer 112 is, for example, gold, silver, copper, or aluminum.

In some embodiments, for further simplification of processes, the material of the top metal layer 112 may be substantially identical to the material of the lead frame 140. For instance, the top metal layer 112 and the lead frame 140 may be formed through the same electroplating process, and in this way, the material of the top metal layer 112 and the material of the lead frame 140 may be substantially identical. Further, the top metal layer 112 and the lead frame 140 may be an integrally-formed structure, such that process steps are reduced, and processes are simplified. Nevertheless, the disclosure should not be construed as limited thereto. In other embodiments, the material of the top metal layer 112 may be different from the material of the lead frame 140. For instance, the top metal layer 112 and the lead frame 140 may be formed in different processed.

In some embodiments, the power devices 120 and the control chip 130 may be electrically connected to the lead frame 140 respectively through a first interconnection 162 and a second interconnection 164. For instance, each of the first interconnection 162 and the second interconnection 164 may include a metal wire, a metal clip, a interposer, or a combination of the foregoing. In the present embodiment, the first interconnection 162 is, for example, an aluminum wire, the second interconnection 164 is, for example, a copper clip, and power conversion may be rapidly achieved with low power loss under such design.

Nevertheless, the electrical connection manner configured for electrically connecting the power devices 120, the control chip 130, and the lead frame 140 is not particularly limited in the disclosure, as long as a direct/indirect electrical connection is provided between the power devices 120 and the control chip 130 and the lead frame 140, such manner is considered to fall within the protection scope of the disclosure. Further, the power devices 120 and the control chip 130 may be electrically connected to each other respectively through the first interconnection 162 and the second interconnection 164.

In some embodiments, the power devices 120 may be electrically connected to each other through a first interconnection 162 and the power devices 120 may be electrically connected to the control chip 130 through a second interconnection 164.

In some embodiments, the first interconnection 162 and the second interconnection 164 may be the interposer, that is, the metal wire and the clip may be not used, wherein the interposer is the insulated heat dissipation substrate 110 including a patterned electric circuit. The patterned electric circuit may electrically connect the power devices 120 to the lead frame 140, or electrically connect the control chip 130 to the lead frame 140. Moreover, the patterned electric circuit may electrically connect the power devices 120 to each other, or electrically connect the power devices 120 to the control chip 130.

In this embodiment, the encapsulant 150 at least encapsulates the power devices 120, the control chip 130, and a portion of the lead frame 140, and the second surface 110*b* is exposed outside the encapsulant 150. In the intelligent power module packaging structure 100 provided by the present embodiment, the power devices 120 and the control chip 130 (providing the gate driver function and the pulse width modulation function for driving the power devices 120) are encapsulated through the encapsulant 150, such that devices providing different functions are integrated into one packaging structure, and distances among the devices are reduced. As such, a parasitic impedance of a driver circuit is effectively decreased, efficiency of the power electronics unit is enhanced, an occupied area is reduced, and an assembly yield is improved. Besides, the power devices 120 and the control chip 130 (including the gate driver and the pulse width modulation controller) are disposed on the first surface 110*a* of the insulated heat dissipation substrate 110, and the second surface 110*b* of the insulated heat dissipation substrate 110 is exposed outside the encapsulant 150. In this way, heat dissipation efficiency of the intelligent power module packaging structure 100 may be enhanced, and favorable performance may thus be achieved.

In some embodiments, the lead frame 140 may extend in the encapsulant 150. For instance, the lead frame 140 may extend from inside the encapsulant 150 to outside the encapsulant 150, and another portion of the lead frame 140 not encapsulated by the encapsulant 150 may act as an outer pin of the intelligent power module packaging structure 100. On the other hand, the encapsulant 150, for example, covers the first surface 110*a* of the insulated heat dissipation substrate 110 and a side wall 110*s* connected to the first surface 110*a* and the second surface 110*b* and a portion of the second surface 110*b*, such that the rest of the second surface 110*b* is exposed.

In some embodiments, the intelligent power module packaging structure 100 may further include a passive device 170 disposed on the first surface 110*a*, and the passive device 170 may be electrically connected to the power devices 120, the control chip 130, and the lead frame 140. For instance, the passive device 170 is, for example, a diode, a resistor, and/or other capacitor structures. Nevertheless, the disclosure should not be construed as limited thereto, and the intelligent power module packaging structure 110 may not include the passive device.

In view of the foregoing, in the intelligent power module packaging structure provided by the disclosure, the power devices and the control chip (including the gate driver and the pulse width modulation controller) are encapsulated through the encapsulant, such that devices providing different functions are integrated into one packaging structure, and distances among the devices are reduced. As such, the parasitic impedance of the driver circuit is effectively reduced, the efficiency of the power electronics unit is enhanced, the occupied area is reduced, and the assembly yield is improved. Besides, the power devices and the control chip (providing the gate driver function and the pulse width modulation function for driving the power devices) are disposed on the first surface of the insulated heat dissipation substrate, and the second surface of the insulated heat dissipation substrate is exposed outside the encapsulant. In this way, heat dissipation efficiency of the intelligent power module packaging structure may be enhanced, and favorable performance may thus be achieved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An intelligent power module packaging structure, comprising:
   an insulated heat dissipation substrate, having a first surface and a second surface opposite to the first surface;
   a plurality of power devices, disposed on the first surface;
   a control chip, disposed on the first surface, wherein the control chip provides a gate driver function for driving the power devices, a pulse width modulation function for controlling the power devices, and the control chip and the insulated heat dissipation substrate overlap in an orthographic direction;
   a lead frame, bonded onto the first surface, wherein the power devices are electrically connected to the control chip and the lead frame; and
   an encapsulant, at least encapsulating the power devices, the control chip, and a portion of the lead frame, wherein the second surface is entirely or partially exposed outside the encapsulant, wherein the insulated heat dissipation substrate comprises a top metal layer close to the first surface, the top metal layer and the lead frame are an integrally-formed structure, the top metal layer is directly in contact with the lead frame, and a material of the top metal layer is substantially identical to a material of the lead frame.

2. The intelligent power module packaging structure according to claim 1, wherein the power devices are disposed on the first surface in a flip chip manner.

3. The intelligent power module packaging structure according to claim 1, wherein the control chip is disposed on the first surface in a die-bonding manner.

4. The intelligent power module packaging structure according to claim 1, wherein the power devices and the control chip are electrically connected to the lead frame respectively through a first interconnection and a second interconnection.

5. The intelligent power module packaging structure according to claim 4, wherein each of the first interconnection and the second interconnection comprises a metal wire, a metal clip, an interposer, or a combination of the foregoing.

6. The intelligent power module packaging structure according to claim 5, wherein the interposer is the insulated heat dissipation substrate including a patterned electric circuit for electrically connecting the power devices to the lead frame, or electrically connecting the control chip to the lead frame.

7. The intelligent power module packaging structure according to claim 1, wherein the power devices are electrically connected to each other through a first interconnection and the power devices are electrically connected to the control chip through a second interconnection.

8. The intelligent power module packaging structure according to claim 7, wherein each of the first interconnection and the second interconnection comprises a metal wire, a metal clip, an interposer, or a combination of the foregoing.

9. The intelligent power module packaging structure according to claim 8, wherein the interposer is the insulated heat dissipation substrate including a patterned electric circuit for electrically connecting the power devices to each other, or electrically connecting the power devices to the control chip.

10. The intelligent power module packaging structure according to claim 1, wherein the lead frame extends from inside the encapsulant to outside the encapsulant, and a portion of the lead frame not covered by the encapsulant acts as an outer pin of the intelligent power module packaging structure.

11. The intelligent power module packaging structure according to claim 1, wherein the intelligent power module packaging structure comprises a passive device disposed on the first surface and electrically connected to the lead frame.

12. The intelligent power module packaging structure according to claim 1, wherein the control chip comprises a motor controller, a gate driver having the gate driver function for driving the power devices, and a pulse width modulation controller having the pulse width modulation function for controlling the power devices.

13. The intelligent power module packaging structure according to claim 1, wherein the insulated heat dissipation substrate comprises a direct bond copper substrate, an insulated metal substrate, or a printed circuit board substrate.

\* \* \* \* \*